United States Patent
Goodnow et al.

(10) Patent No.: US 7,304,493 B2
(45) Date of Patent: Dec. 4, 2007

(54) FPGA POWERUP TO KNOWN FUNCTIONAL STATE

(75) Inventors: Kenneth J. Goodnow, Essex Junction, VT (US); Clarence R. Ogilvie, Huntington, VT (US); Christopher B. Reynolds, Milton, VT (US); Jack R. Smith, South Burlington, VT (US); Sebastian T. Ventrone, South Burlington, VT (US); Keith R. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 11/371,833

(22) Filed: Mar. 9, 2006

(65) Prior Publication Data

US 2007/0075736 A1 Apr. 5, 2007

Related U.S. Application Data

(63) Continuation-in-part of application No. 11/162,997, filed on Sep. 30, 2005.

(51) Int. Cl.
*H03K 19/00* (2006.01)

(52) U.S. Cl. .............................. 326/16; 326/38; 326/40

(58) Field of Classification Search ................... 326/16, 326/38–41
See application file for complete search history.

(56) References Cited

U.S. PATENT DOCUMENTS

| | | | |
|---|---|---|---|
| 5,705,938 A | 1/1998 | Kean | |
| 5,847,993 A | 12/1998 | Dejenfelt | |
| 6,144,580 A | 11/2000 | Murray | |
| RE37,195 E | 5/2001 | Kean | |
| 6,297,989 B1 | 10/2001 | Cloud et al. | |
| 6,356,637 B1 | 3/2002 | Garnett | |
| 6,496,971 B1 | 12/2002 | Lesea et al. | |
| 6,630,838 B1 * | 10/2003 | Wong | 324/763 |
| 6,631,520 B1 | 10/2003 | Theron et al. | |
| 6,662,302 B1 | 12/2003 | Garey | |
| 2002/0015322 A1 | 2/2002 | Cloud et al. | |
| 2003/0200418 A1 * | 10/2003 | DeHon et al. | 712/15 |

* cited by examiner

*Primary Examiner*—Anh Q. Tran
(74) *Attorney, Agent, or Firm*—Michael J. LeStrange; Hoffman, Warnick & D'Alessandro LLC

(57) ABSTRACT

A field programmable gate array (FPGA) device including a non-programming-based default power-on electronic configuration. The non-programming-based default power-on electronic configuration defines a default state to initial a first logic function. Upon power-up, the FPGA device would be enabled to enter the default state without having first to be configured via a conventional programming mode, thus saving processing time during power-up. Several embodiments are disclosed, such as a mask via circuit, an asynchronous set/reset circuit, an unbalanced latch circuit and a flush and scan circuit. A related method is also disclosed to reduce the memory size dedicated to the first logic function to facilitate further programming after power-up. In addition to time saving and further programming, the FPGA device can also allow partial or incremental programming to expand the full functionality to match customer's different needs.

20 Claims, 11 Drawing Sheets

FPGA POWERUP TO KNOWN FUNCTIONAL STATE

This is a continuation-in-part application of co-pending U.S. patent application, Ser. No. 11/162,997, filed Sep. 30, 2005.

BACKGROUND OF THE INVENTION

1. Technical Field

The present invention relates generally to programmable logic devices, and more particularly to field programmable gate arrays (FPGAs) having a non-programming-based default power-on electronic configuration to shorten the power-up, reconfiguration and/or reset time.

2. Related Art

Programmable logic devices (PLDs) are a well-known type of integrated circuit (IC) that may be programmed by a circuit designer to perform user-specified logic functions. One common type of PLD is a field programmable gate array (FPGA). An FPGA is a general purpose programmable device that is customizable by an end user to realize a desired user-specific circuit. Typically, the FPGA includes fabric elements such as configurable logic blocks (CLBs), input/output blocks (IOBs), and an interconnect that programmably connects the CLBs and IOBs. The function or configuration of the CLBs, IOBs, and interconnect is determined by an externally stored bitstream. The bitstream is a stream of control bits and is generally stored in an external device including non-volatile memory, such as read only memory (ROM), programmable ROM (PROM), erasable PROM (EPROM), floppy disk, hard disk file, or network. Either at a power-up "configuration" phase or a "reconfiguration" phase after power-up, the stored bitstream and/or programming bits are loaded in the fabric elements of the FPGA. That is, configuration/reconfiguration can be viewed as a process of loading/reloading the bitstream and/or programming bits into the configuration memory cells which control the programmable interconnect structure, the IOBs, and the CLBs. Therefore, the bitstream and/or programming bits can usually be termed "configuration data."

The configuration data is loaded into and held in memory cells in the FPGA via an interface circuit. The interface circuit may include a standard serial interface available on present FPGA devices. The memory cells (or configuration memory cells) of the FPGA itself may be implemented using volatile or non-volatile memory technology, such as static random access memory (SRAM) technology, thereby facilitating reconfiguration and providing design flexibility. The SRAM memory cell controls one or more transistors at the configurable points in the FPGA or serves as one or more entries in a lookup table. The configuration memory cells collectively determine what functions the FPGA will implement.

Some commercially available SRAM FPGAs, for example, the FPGA products from Altera Corporation or Xillinx, Inc., have a stream-based interface to the SRAM configuration memory. For some stream based interfaces, in order to make any changes in the configuration, an entire section of the configuration memory must be reloaded. Configuration information may be loaded from a variety of sources, for example, from the memory accessed by a microprocessor, from a non-volatile PROM under control of the FPGA itself (see U.S. Reissue Pat. No. 34,363), or by mapping the FPGA configuration memory into the address space of the microprocessor. Should it become desirable to change or update the configuration of the FPGA, e.g., so as to enable the FPGA to be used with other devices of varying configurations and compatibility standards, the associated external memory is re-programmed with the new configuration design. Upon subsequent boot-up, the FPGA then reads the new configuration design from the associated external memory, and then configures itself accordingly.

In this design and arrangement, FPGAs provide extreme flexibility in implementing an electrical circuit because the logical functions and interconnection of logic elements can be configured without additional fabrication process steps. Accordingly, because of the ease in changing the logical configuration of the logic elements, FPGAs are recognized as a time and resource efficient method for verifying the design of the electrical circuit.

However, there are some drawbacks in the current standard FPGA operation, especially during a power-up or reconfiguration phase. The configuration of the FPGA, which is determined by the externally stored bitstream and/or programming bits, is typically loaded from a non-volatile configuration memory into the SRAM configuration memory cells when power is applied to the FPGA device. Upon power-up or during a reconfiguration time after power-up, the FPGA under the current design first goes into a "disabled" mode for a transient time period. In the "disabled" mode, the functional state of the FPGA is not yet established, i.e., non-functional state, and it is not yet useful. The externally stored bitstream has to be loaded into the FPGA to facilitate later functional operations. However, the transient time period for the external bitstream loading normally consumes up to several seconds. This is relatively a long time in terms of an integrated circuit, which generally measures each instruction time/cycle in ns ($10^{-9}$ Seconds) or even ps ($10^{-12}$ Seconds). Therefore, a need exists in the FPGA art for a system and method to shorten such a long transient time to speed up the FPGA operation, especially during the FPGA power-up or reconfiguration phase.

SUMMARY OF THE INVENTION

The present invention provides a field programmable gate array (FPGA) device and related method wherein a portion or the entire FPGA fabric has a predefined function upon power up by the incorporation of a non-programming-based default power-on electronic configuration so as to allow a faster power-up and/or reconfiguration.

A first aspect of the present invention provides a field programmable gate array (FPGA) device comprising: a non-programming-based default power-on electronic configuration defining a default state to initial a first logic function so that, upon power-up, the FPGA device is enabled to enter the default state without being configured via a programming mode; and a built-in self test (BIST) element configured to perform a power-up self test of the FPGA.

A second aspect of the present invention provides a method of configuring a field programmable gate array (FPGA) device, the method comprising: providing a non-programming-based default power-on electronic configuration defining a default state to initial a first logic function; upon power-up, enabling the FPGA device to enter the default state without being configured via a programming mode; and performing a power-up self test of the FPGA device using a built-in self test (BIST) element.

A third aspect of the present invention provides method of configuring a field programmable gate array (FPGA) with a first logic function having an initialized logic state and a second logic function having an un-initialized logic state, the method comprising: (a) providing an on-chip non-volatile memory capable of partially configuring a configuration memory of the FPGA with the first logic function; (b) providing an on-chip volatile memory capable of programming the configuration memory with the second logic function; (c) identifying a predefined portion of a programmable resource dedicated to the first logic function; (d) reducing a size of the non-volatile memory in correspondence with the predefined portion of the programmable resource dedicated to the first logic function; (e) providing a fixed interconnect structure corresponding to the first logic function; and (f) performing a power-up self test of the FPGA device using a built-in self test (BIST) element.

The foregoing and other features of the invention will be apparent from the following more particular description of embodiments of the invention, as illustrated in the accompanying drawings.

BRIEF DESCRIPTION OF THE DRAWINGS

Embodiments of the present invention will hereinafter be described in conjunction with the appended drawings, where like designations denote like elements, and wherein.

DETAILED DESCRIPTION OF THE INVENTION

Figure 1:
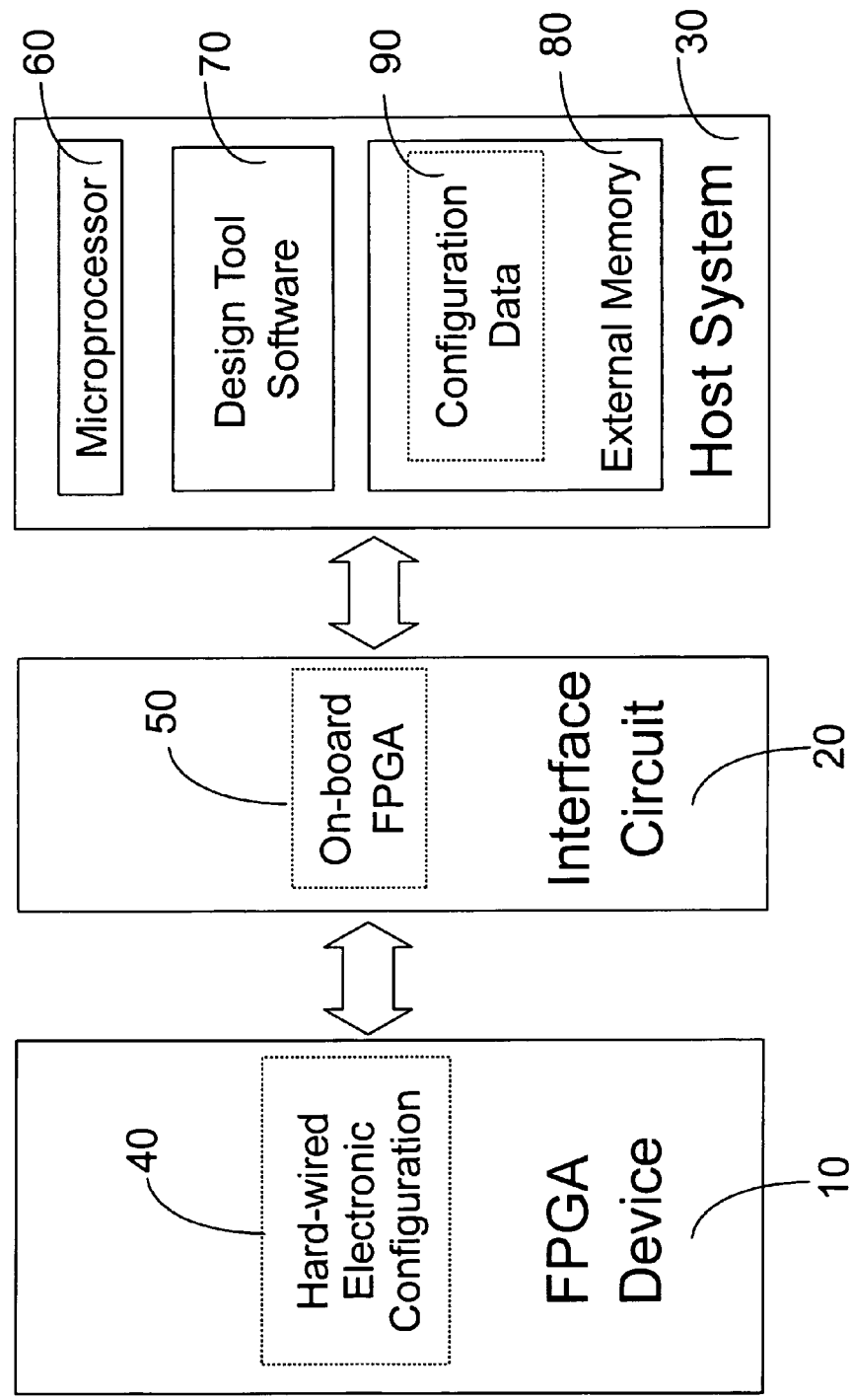
FIG. 1 is a block diagram of an overall FPGA system in accordance with the invention.

With reference to the accompanying drawings, FIG. 1 is a block diagram of an overall FPGA system in accordance with the invention. The overall FPGA system according to the present invention may include a field programmable gate array (FPGA) device 10, an interface circuit 20 and a host system 30.

FPGA device 10 in accordance with the invention comprises a non-programming-based default power-on electronic configuration 40. Such a non-programming-based default power-on electronic configuration 40 could be designed to define a default state to initialize and perform a first predefined logic function. In this setting, upon power-up, FPGA device 10 does not enter a "disabled" mode as a traditionally-designed FPGA device does, and is not initialized to load the externally stored bitstream and/or programming bits (configuration data). Rather, FPGA device 10 according to the present invention is automatically initialized to perform the predefined/pre-designed logic function based on the actual non-programming-based default power-on electronic configuration 40 embedded therein. Such a logic function is designed as a default known state, which can accomplish some useful or specifically desired function. Embodiments of non-programming-based default power-on electronic configuration 40 according to the invention are introduced and explained more thoroughly in FIG. 3 to FIG. 7 and the accompanying paragraphs.

Host system 30 may include a microprocessor 60, a design tool software 70, and an external memory 80 having configuration data 90 stored therein. Host system 30, such as a personal computer or workstation, serves as a data/signal source to provide configuration data 90 if further programming for performing other logic functions is desired. Well known design tool software 70, for example Verilog HDL, operating on a suitable microprocessor 60 within host system 30 creates the configuration data 90 to be stored in external memory 80. Configuration data 90 can be downloaded from host system 30 to FPGA device 10 via interface circuit 20 after power-up, reconfiguration and/or reset. Configuration data 90 embodies the further logic functions desired to be implemented by FPGA device 10 after the first predefined logic function is established. That is, the downloaded configuration data 90 can then allow FPGA device 10 to migrate to a second state or other logic functions.

Interface circuit 20 can also include an optional IC (for example, another on-board FPGA 50) that customizes configuration data 90 received from host system 30 into a format usable by FPGA device 10, although in some embodiments host system 30 microprocessor 60 is used to customize configuration data 90 for FPGA device 10. Since an on-board FPGA 50 is able to customize configuration data 90 at a rate much faster than that of host system 30's microprocessor 60, interface circuit 20 having an on-board FPGA 50 is preferred and would generally provide superior performance.

Figure 2:
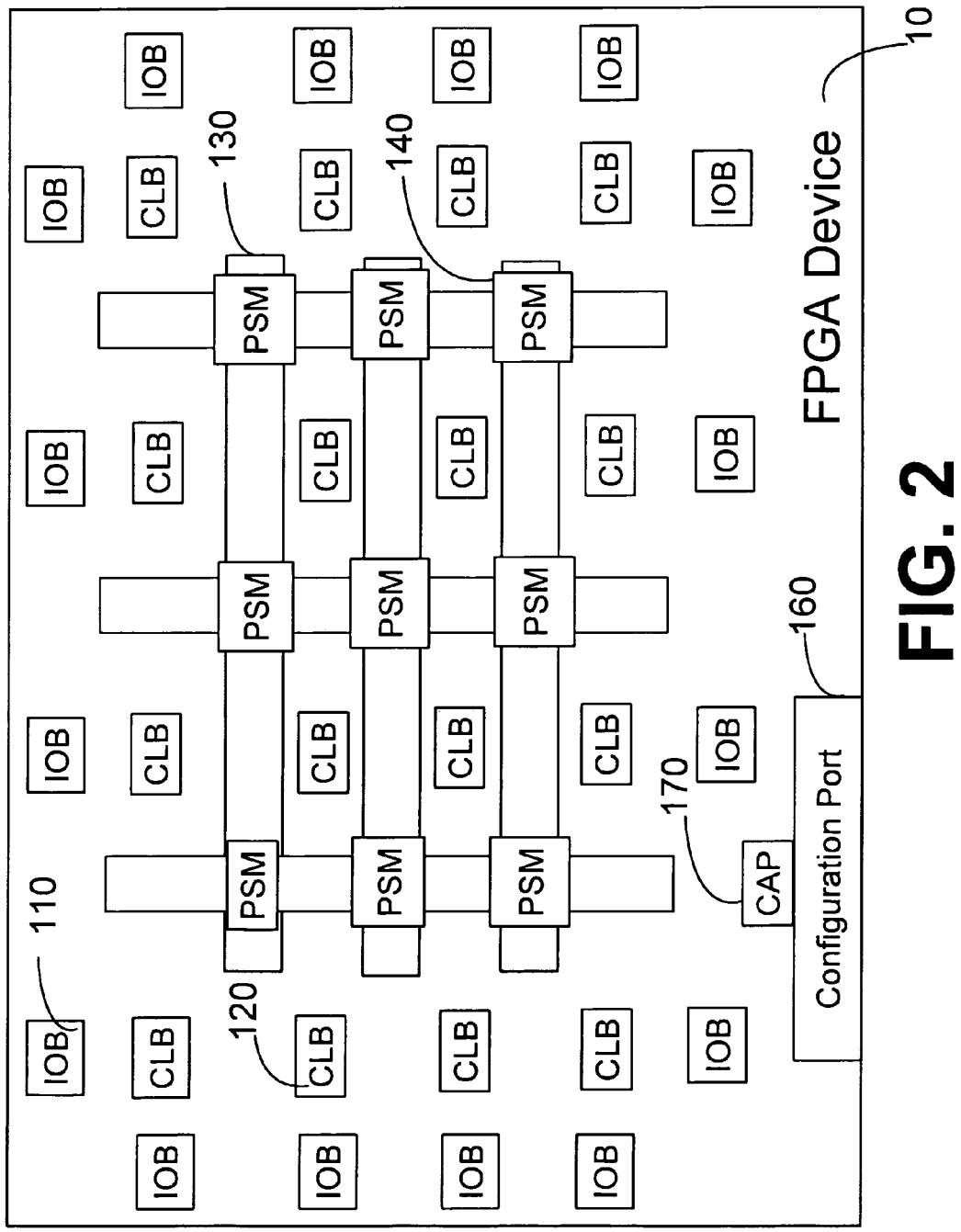
FIG. 2 is a simplified top-down diagram of a field programmable gate array (FPGA) device in accordance with an embodiment of the present invention.

FIG. 2 shows a simplified top-down diagram of an FPGA device 10 in accordance with an embodiment of the present invention. FPGA device 10 includes a ring of input/output blocks (IOBs) 110, an inner two-dimensional array of configurable logic blocks (CLBS) 120, and a programmable interconnect structure 130 having a matrix of programmable switches (PSMs) 140. IOBs 110, CLBs 120, and PSMs 140 contain configuration memory cells shown in FIG. 3, the contents of which determine how IOBs 110, CLBs 120, and PSMs 140 are configured and what kinds of functions would be performed. These configuration memory cells control various switches and multiplexers within respective IOBs 110, CLBs 120, and PSMs 140 which implement logic and routing functions specified by either their respective non-programming-based default power-on configuration or configuration data 90 loaded into the memory cells. These configuration memory cells are organized, for conceptual and loading purposes, in a two-dimensional array. Configuration data 90 is provided to FPGA device 10 via a configuration port 160 and thereafter routed to the configuration memory cells. Configuration port 160 is connected to the configuration memory cells by a configuration access port (CAP) 170, which is essentially a bus access point.

Each IOB 110 includes a terminal in the sense that IOB 110 provides a location at which a connection is made to FPGA device 10. The location is usually a bonding pad of IOB 110 and the connection to the bonding pad is usually a bonding wire that forms an electrical connection from the bonding pad to an integrated circuit package containing FPGA device 10. CLBs 120 are individually programmable and can be configured, either in a non-programming-based default power-on, firmware or software manner, to perform a variety of logic functions ranging from simple AND gates to more complex functions of a few input signals. Programmable interconnect structure 130 includes PSMs 140 that can be configured to selectively route signals between various CLBs 120 and IOBs 110 and thus produce more complex functions of many input signals. IOBs 110 can be configured to drive output signals from CLBs 120 to external pins (not shown) of FPGA device 10 and/or to receive input signals from the external pins of FPGA device 10. For additional information on the structure of FPGA device 10 in general, including the structure and operation of IOBs 110, CLBs 120, programmable interconnect structure 130 and PSMs 140, see: U.S. Pat. No. 5,705,938 issued Jan. 6, 1998, entitled "PROGRAMMABLE SWITCH FOR FPGA INPUT/OUTPUT SIGNALS." To facilitate a faster power-up, reconfiguration and/or reset, the present invention builds in a non-programming-based default power-on electronic configuration 40 in FPGA device 10. Because non-programming-based default power-on electronic configuration 40 defines a default known state to initialize a first logic function, it is not necessary to load configuration data 90 into FPGA device 10 for the purpose of establishing a useful functional state upon power-up, reconfiguration and/or reset. The actual function to be performed in the default known state can be designed according to a practical need, which can vary depending on the individual design. For example, the logic function can be designed and implemented to perform either a simple operation or a more sophisticated instruction set. For example, a simple operation can be an "add" function to add a stored data "A" and a stored data "B," or a "shift" function. It can also be a more sophisticated instruction set that may need several cycles to be accomplished. In a case where only a simple operation is desired for the default logic function, only one or a few IOBs 110, CLBs 120, and/or PSMs 140 would be needed to establish the corresponding functionality. In another case where a more complex instruction set is desired, more IOBs 110, CLBs 120, and/or PSMs 140 might be involved to establish the corresponding functionality. Therefore, no configuration memory cells of CLBs 120 and/or PSMs 140 may be required for non-programming-based default power-on configuration to build up the desired default logic function. The rest of the configuration memory cells in FPGA device 10 can be loaded with configuration data 90 and programmed for further logic functions via design tool software 70 in host system 30. It is noted that "partial programming" or "incremental programming" skill can also be employed in accordance with the present invention. That is, in some cases, the default logic function can be merely a subset of the overall function that the designer would like to be implemented in FPGA device 10. In this case, a subset function may be maintained for the entire power up state, and the other portion of the FPGA fabric of the configuration memory cells would be left for reprogramming by the loading of configuration data 90.

Figure 3:
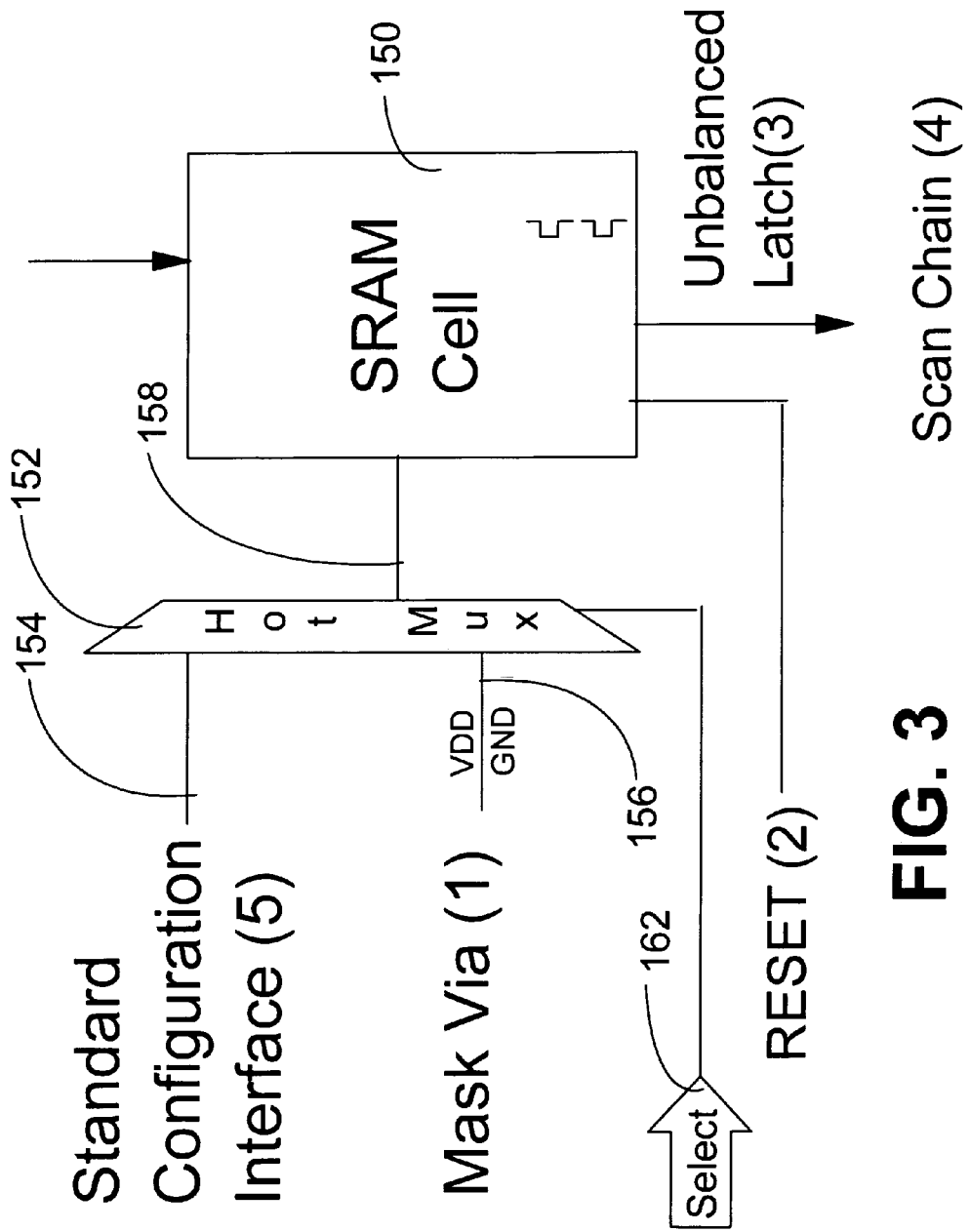
FIG. 3 is a schematic diagram of several configuration methods for the FPGA device in accordance with the present invention.

Because the default known state to perform the designed logic function is configured in a non-programming-based default power-on manner, the functional connection will be available when the FPGA device 10 is powered on or reset. This enables FPGA device 10 of the invention to enter the default state without having to be configured via a traditional programming mode or a scan-program mode to establish its initial functionality. That is, a traditional configuration is not required in the present invention to establish its first programming state of FPGA device 10. This would therefore save transient and programming time and allow non-programming-based default power-on function to be delivered with the ASIC device. Embodiments of the non-programming-based default power-on electronic configuration 40 according to the invention are introduced and explained more thoroughly in the following paragraphs. FIG. 3 shows a schematic diagram of several configuration methods for the FPGA device in accordance with the present invention. The non-programming-based default power-on electronic configuration can be realized in several ways in accordance with FPGA device 10 shown in FIG. 1 of the present invention, for example: (1) mask via, (2) reset, (3) unbalanced latch, and (4) scan chain. These embodiments in accordance with the present invention will be thoroughly explained in the accompanying FIG. 4 to FIG. 7. Configuration memory cells 150 associated with IOBs 110, CLBs 120 and/or PSMs 140 in FPGA device 10 can be, for example, SRAM cells. A selector, for example a multiplexer 152, can be optionally incorporated in FPGA device 10 for selection purposes. In this embodiment, multiplexer 152 has two input lines 154, 156, an output line 158 and a select line 162. Select line 162 decides which input lines 154, 156 will be directed to the output line 158. For example, if a mask via configuration is desired for power-up/reconfiguration/reset, selection can be made via select line 162 to direct input line 156 to output line 158. If after power-up, a standard configuration interface is needed for programming further logic functions, selection can also be made via select line 162 to direct input line 154 to output line 158.

Figure 4:
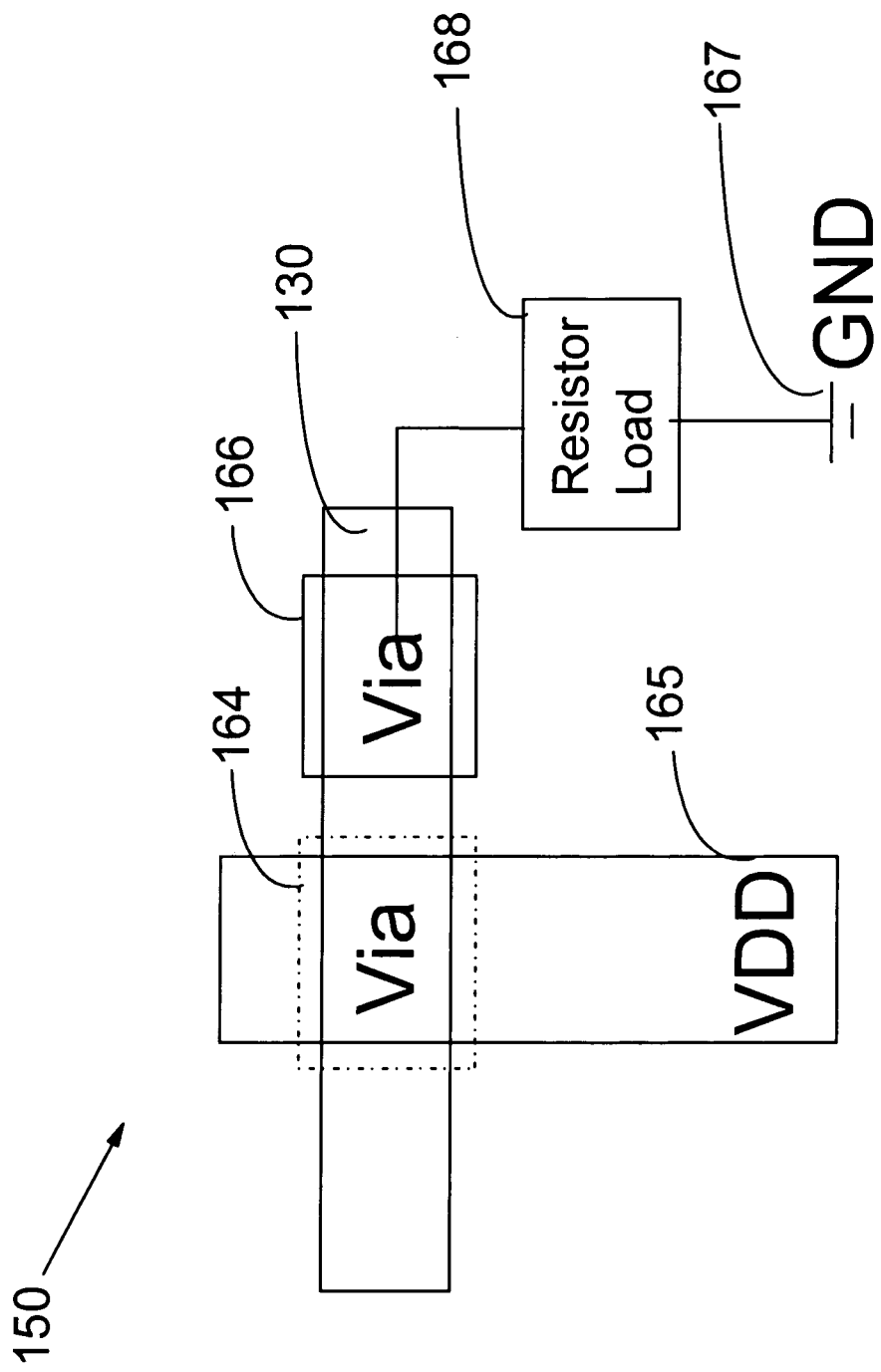
FIG. 4 is a schematic diagram of a mask via configuration in accordance with one embodiment of the present invention.

FIG. 4 shows a schematic diagram of a mask via configuration in accordance with one embodiment of the present invention. The non-programming-based default power-on electronic configuration can be a mask via circuit including a plurality of configuration memory cells, for example SRAM cells. For illustration and clarification purposes, only one SRAM cell in FPGA device 10 is depicted in FIG. 4. In the SRAM cell, there is a voltage source (VDD) 165, a ground line (GND) 167, a wire strap 130 (part of the programmable interconnect structure), a resistor load 168, and a mask via subject to two possible positions 164 (phantom) and 166. In order to make a non-programming-based default power-on configuration by means of the mask via circuit, the via of the SRAM cell can either be placed in position 164 to connect to VDD 165 or in position 166 to connect to GND 167 through a resistor load 168. If the via is made in position 164, wire strap 130 would connect to VDD 165, thus representing a logic "1." If the via is made in position 166, wire straps 130 would connect to GND 167 through a resistor load 168, thus representing a logic "0." Similar design approaches of the non-programming-based default power-on configuration can be made in other SRAM cells of FPGA device 10. That is, each of the SRAM cells is capable of being configured to either VDD 165 or GND 167 by the different positions 164 or 166 of the respective mask via so that the mask via circuit can be configured to define the default known state. The configured SRAM cells in their totality will perform the first logic function (for example, "add" function) so that, upon power-up, FPGA device 10 would be automatically enabled to this default known state.

Figure 5:
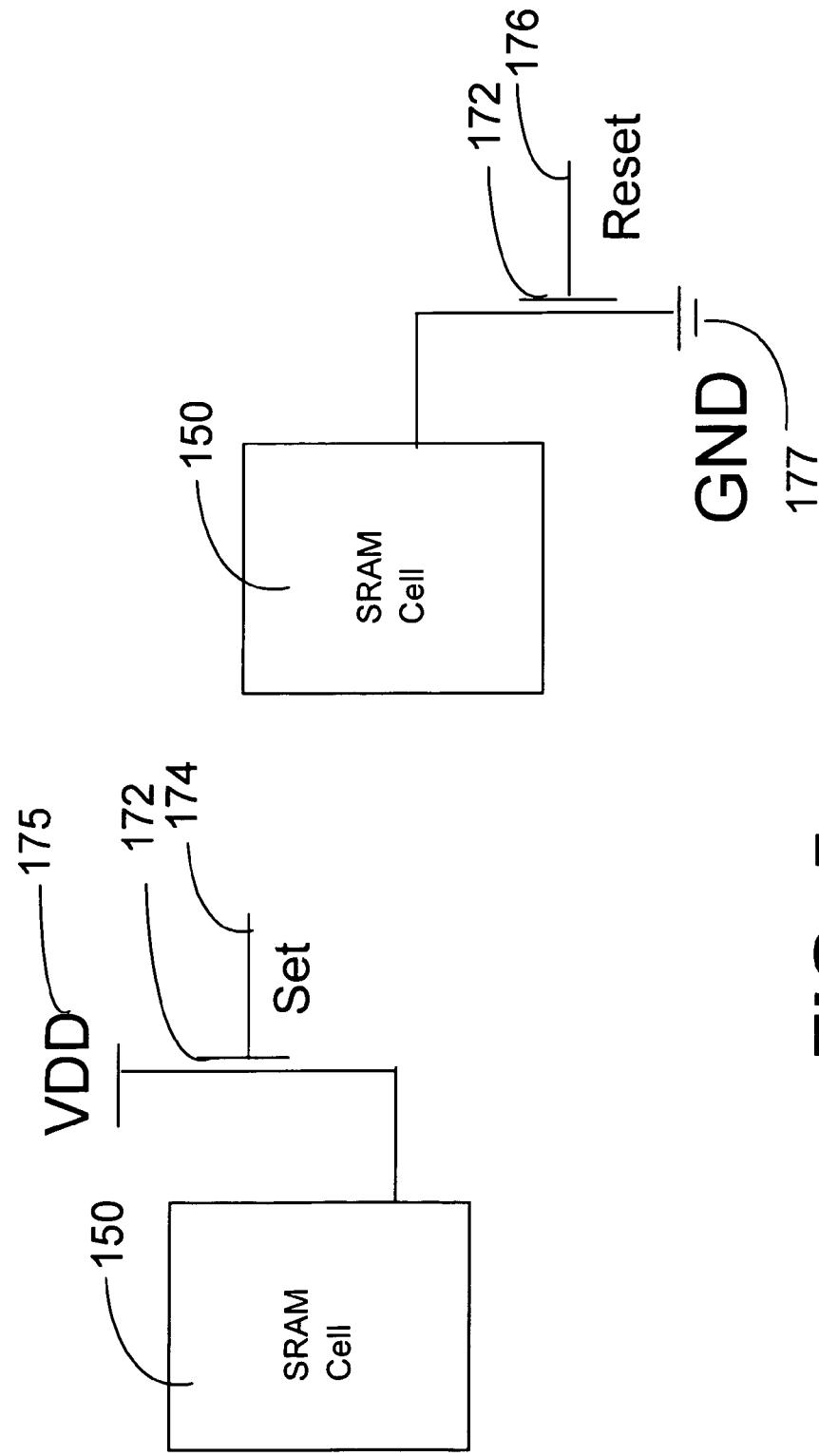
FIG. 5 is a schematic diagram of a set/reset configuration in accordance with one embodiment of the present invention.

Returning to FIG. 3, in a real application, upon power-up, multiplexer 152 is selected in a manner that configures all SRAM cells in parallel. This technique is different than the standard method of using a serial chain to configure the SRAM cells. Once the configuration is complete, multiplexer 152 is switched back to standard configuration interface path 154 to allow subsequent programming by host system 30. FIG. 5 shows a schematic diagram of a set/reset configuration in accordance with one embodiment of the present invention. In FIG. 5, the non-programming-based default power-on electronic configuration is an asynchronous set/reset circuit including a plurality of configuration memory cells 150, a plurality of switches 172, a voltage source (VDD) 175 and a ground line (GND) 177. A control signal line, either a set signal 174 or a reset signal 176, is connected to each device of SRAM cell 150 through switch 172 such that either SRAM cell 150 is set to VDD 175 or GND 177 during an active reset. The multiplexer serial path is deselected when reset is asserted, forcing the default state into the SRAM cell. Upon the release of reset, FPGA device 10 is at the fully defined state, and ready for operation with the default function now configured into the hardware. That is, by configuring the plurality of configuration memory cells to either the VDD or the GND through the control of corresponding switches 172, the asynchronous set/reset circuit would automatically configure the default logic function upon power-up.

Figure 6:
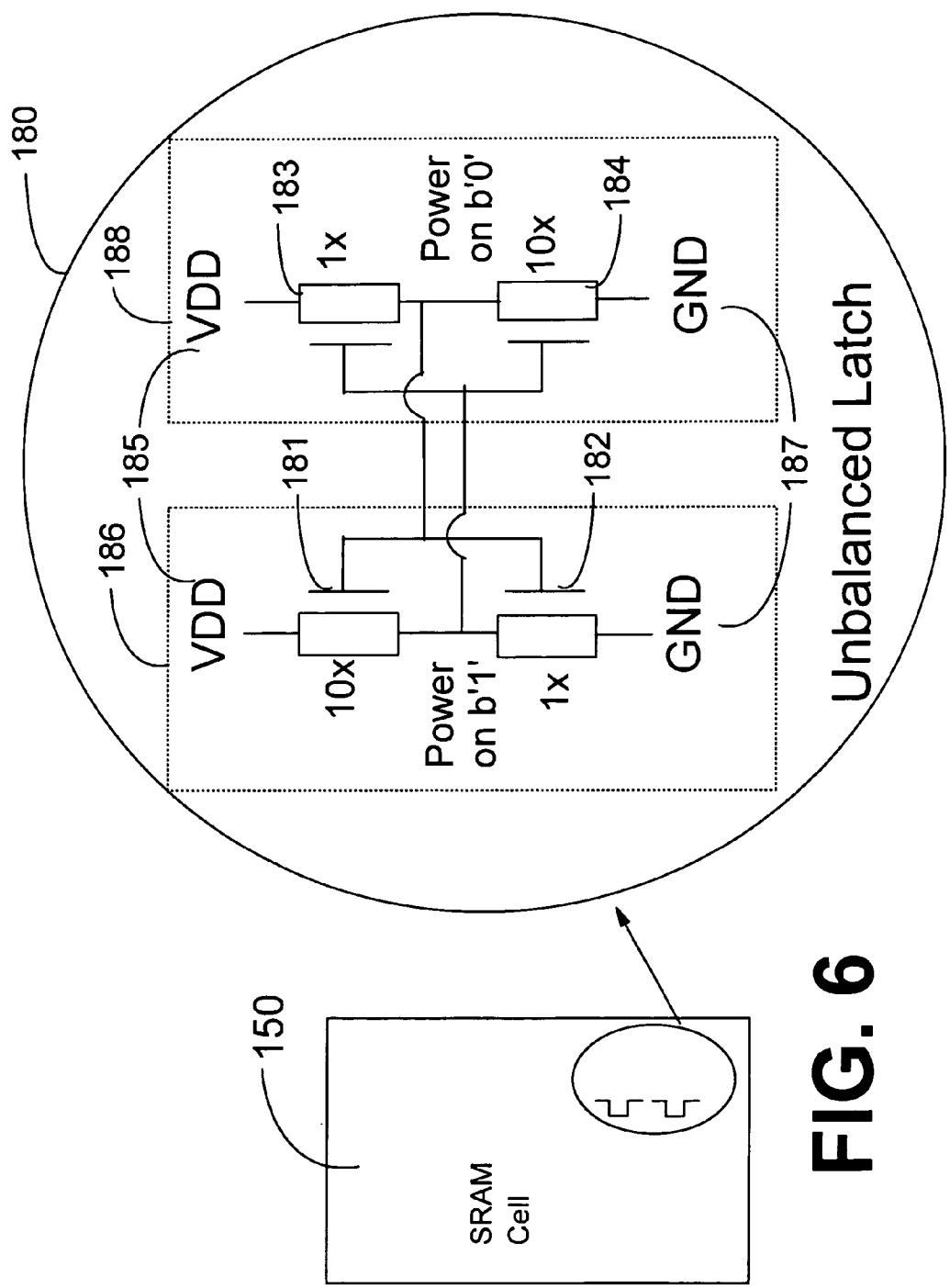
FIG. 6 is a schematic diagram of an unbalanced latch configuration in accordance with one embodiment of the present invention.

FIG. 6 shows a schematic diagram of an unbalanced latch or SRAM cell configuration in accordance with one embodiment of the present invention. Another approach to realize the non-programming-based default power-on configuration in accordance with the present invention is to design an unbalanced latch circuit 180 associated with SRAM cell 150. The latch circuit may present the data state immediately on power-up without any need for recall sequencing or for loading external configuration data. One embodiment of unbalanced latch circuit 180 is shown in FIG. 6. Unbalanced latch circuit 180 includes a left (first) side circuit 186 and a right (second) side circuit 188. There are mainly two component transistors on each side circuit, namely transistors 181 and 182 on left side circuit 186 and transistors 183 and 184 on right side circuit 188. In left side circuit 186, transistor 181 is connected to VDD 186 and transistor 182 is connected to GND 187. The resistor or capacitor load of transistor 181 is many times (e.g. 10 times) greater than transistor 182 so as to render an "unbalanced" status. In right side circuit 188, transistor 183 is connected to VDD 186 and transistor 184 is connected to GND 187. The resistor or capacitor load of transistor 184 is also many times (e.g. 10 times) greater than transistor 183 so as to render an "unbalanced" status.

Figure 7:
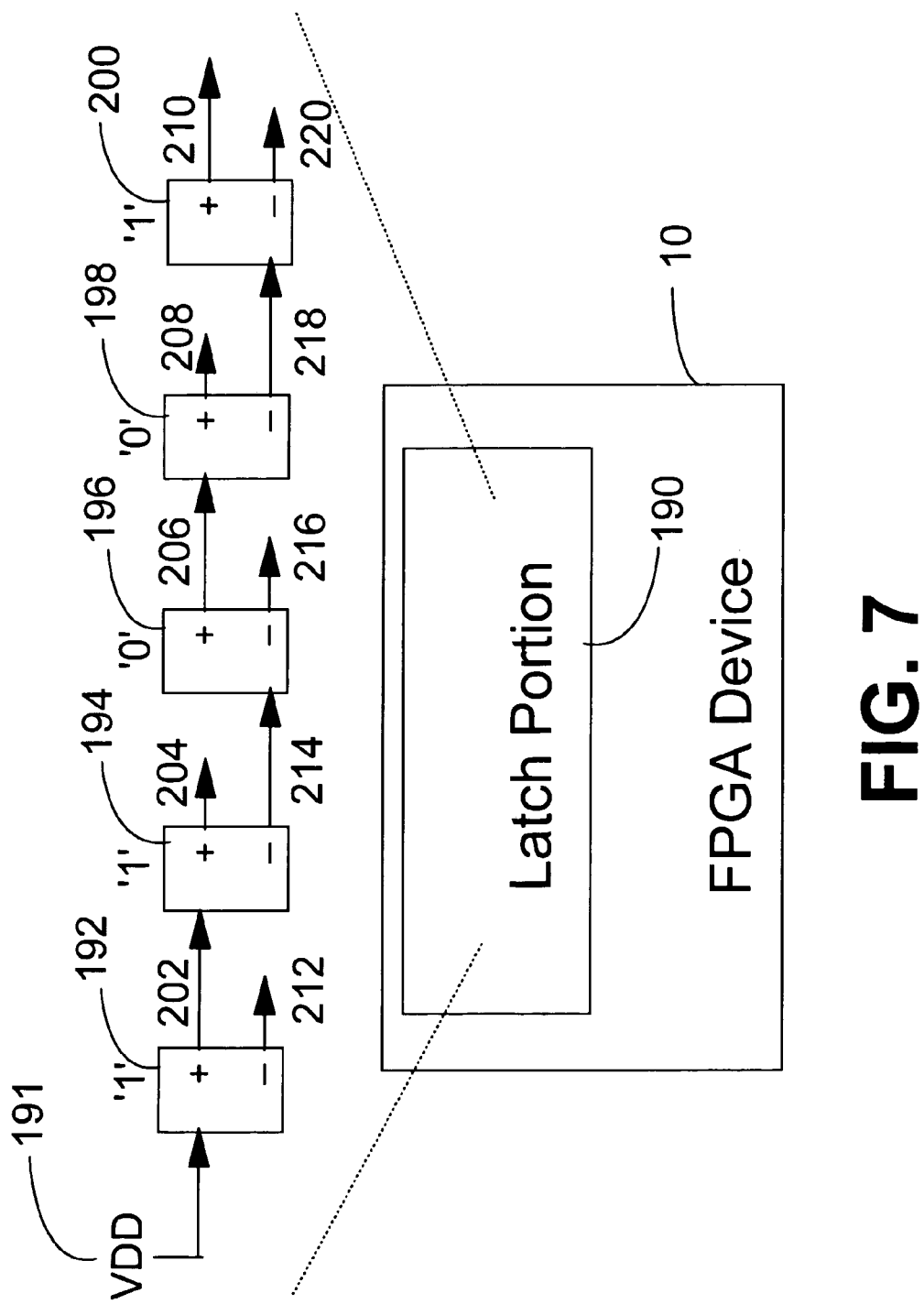
FIG. 7 is a schematic diagram of a scan chain configuration in accordance with one embodiment of the present invention.

When either left side circuit 186 or right side circuit 188 is loaded, unbalanced latch circuit 180 associated with SRAM cell 150 always comes up in a known state. When left side circuit 186 is loaded, unbalanced latch circuit 180 will power up in a binary '1' state. When right side circuit 188 is loaded, unbalanced latch circuit 180 will power up in a binary '0' state. In this configuration, FPGA device 10 can be designed to power up in the desired state, causing the FPGA to perform a specific default function. FIG. 7 shows a schematic diagram of a scan chain configuration in accordance with one embodiment of the present invention. In this embodiment, FPGA device 10 includes a latch portion 190 having a plurality of latch elements 192, 194, 196, 198 and 200 in a series. Each latch element 192, 194, 196, 198, 200 has two legs (positive leg "+" 202, 204, 206, 208, 210 and negative leg "−" 212, 214, 216, 218, 220) for outputting signals to the next latch element. The function of the positive leg is to maintain the previous binary state and the negative leg is to change the previous binary state to the other binary state. For example as shown in FIG. 7, latch element 192 is connected to VDD 191 and a binary state "1" is rendered. If positive leg 202 is connected to the next latch element 194, the binary state "1" will be maintained. If negative leg 214 of latch element 194 is connected to the next latch element 196, the binary state of latch element 196 would be made different from that of latch element 194, thus rendering the binary state "0" of latch element 196. If positive leg 206 of latch element 196 is connected to the next latch element 198, the binary state "0" will be maintained. If negative leg 218 of latch element 198 is connected to the next latch element 200, the binary state of latch element 200 would be made different from that of latch element 198, thus rendering the binary state "1" of latch element 200.

Therefore, a portion of latch portion 190 of FPGA device 10 can be reset with "flush and scan." Upon power-up, clocks locked on, all the latch elements 192, 194, 196, 198, 200 are set to a known state depending upon whether or not the positive legs 202, 204, 206, 208, 210/negative legs 212, 214, 216, 218, 220 are picked to set states. As VDD 191 is connected to the first latch element 192 of latch portion 190, the signal would automatically "flush and scan" through a series of latch elements 194, 196, 198, 200, etc. That means, after the "flush and scan" begins its path, no clock signal is further needed for triggering the operation of the latch elements in series. As shown in FIG. 7, a series of binary states "11001" are thus rendered. A known default state can then be designed in this manner to perform a specific function under the flush and scan configuration. It should be recognized that the number of the latch elements are only illustrative in the aforementioned description.

It is also worth mentioning how the default state and the associated first logic function can be actually realized in the aforementioned various kinds of non-programming-based default power-on electronic configurations embedded in FPGA device 10. In the design phase, the first logic function can be simulated and verified the same as the usual and standard IC design process. Afterwards, the functional simulation must be linked to the physical non-programming-based default power-on configuration such that the functional design as built will have a default value in FPGA device 10. That is, actions have to be taken to link the logical states of zeros/ones default setting to the physical non-programming-based default power-on design of each latch or via connection. A Netlist configuration will be written out to carry out the actions, and then an auto script will program FPGA device 10 to a set configuration (still a virtual copy). A scan of this virtual copy will determine which cells are 0 and 1. From this list, each cell of Graphic Design System II (GDSII) file format will either be replaced with the correct unbalanced latches (if unbalanced latch method is used), or will cause an auto placement of the via (if zero, via is left out, if one then via is added).

GDSII is well known to persons skilled in the IC design and fabrication art. GDSII is essentially a binary file format which is classified as a "data interchange format," used for transferring mask-design data between the IC designer and the fabrication foundry. GDSII data and files are considered to be a final output the IC design cycle and are passed to IC fabrication foundrys for IC fabrication. At the fabrication foundry, the GDSII data is converted into a machine-readable language called Computer Aided Transcription Software (CATS), which transcribes the data so that it can be read by the photomask systems used in the manufacture of IC semiconductors. The end result of such functional design reflects the virtual default state of the first logic function. However, it is no longer virtual since it is actual GDSII, which is a physical representation of the functional design. When the hardware of the FPGA device 10 is fabricated according to the GDSII data and exits the fabrication foundry, the default function is now built in for initiating the FPGA device 10 upon power-up, reconfiguration and/or reset.

Figure 8:
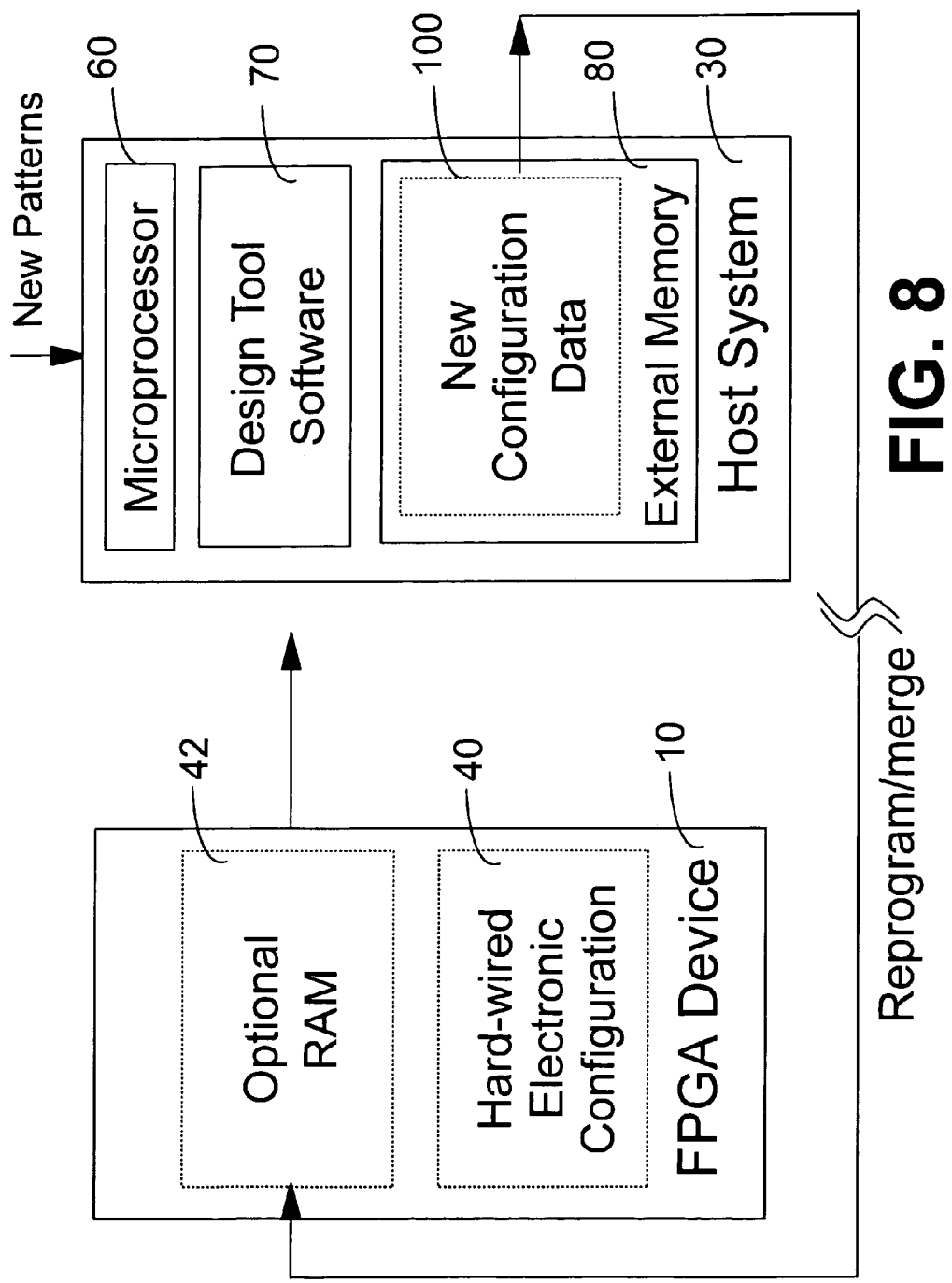
FIG. 8 is a block diagram depicting a reprogram/merge process when new patterns are to be programmed into the FPGA device.

FIG. 8 is a block diagram depicting a reprogram/merge process when new patterns are to be programmed into the FPGA device. After power-up, FPGA device 10 is naturally and automatically set to a default state to perform the function designed by the non-programming-based default power-on electronic configuration 40 as explained above. When further programming is desired, FPGA device 10 is capable of being re-programmed by an electronic design automation tool via a traditional firmware/software programming mode. New patterns can be input to external memory 80 via the interface provided by the electronic design automation tool, for example design tool software 70 as shown in FIG. 1. The inputted new patterns are stored in external memory 80 as new configuration data 100 to program the not-yet-configured memory cells in optional RAM 42. This can allow the incremental programming of FPGA device 10 based on the existing non-programming-based default power-on configured logic function. The incremental programming can expand the existing default logic function in FPGA device 10 to a fuller stage, or add other unrelated functions to FPGA device 10 to realize further circuit implementations. It is also noted that, due to the limited total memory capacity in FPGA device 10, a simpler default logic function is preferred because it would take fewer memory cells for non-programming-based default power-on configuration, potentially reducing the memory footprint needed to store future configurations. Therefore, for the programmable resource dedicated to the default logic function, the size of the corresponding memory space (usually non-volatile memory) is preferably reduced. Then a fixed interconnect structure including IOBs 110, CLBs 120, programmable interconnect structure 130 and PSMs 140 can be provided just to realize the corresponding default (first) logic function.

The present invention also provides a method of configuring an FPGA device as shown in FIG. 1. The method in accordance with the invention first provides a non-programming-based default power-on electronic configuration 40 in FPGA device 10. The non-programming-based default power-on electronic configuration 40 is generally a physically silicon-implemented circuit, which defines a default state to initial and perform a first logic function. For example, the actual implementation can be a mask via configuration, a set/reset configuration, an unbalanced latch configuration, or a scan chain configuration. The first logic function can be designed as a simple operation to perform an "add" function to add a stored data "A" and a stored data "B," or a "shift" function, etc. It can also be a more sophisticated instruction set which might need several signal cycles to be accomplished. The implementation details can be referred in FIG. 3 to FIG. 7 and the accompanying description, and are not repeated here. Upon power-up, FPGA device 10 would then be automatically enabled to enter the designed default state without having first to be configured via a conventional programming mode. In this setting, FPGA programming time can be saved during power-up.

After power-up, if further programming for performing other logic functions is desired, FPGA device 10 may be re-programmed with the desired logic functions by an electronic design automation tool via a software programming mode. As shown in FIG. 1, well known design tool software 70 operating on a suitable microprocessor 60 within host system 30 creates configuration data 90 to be stored the external memory 80. Configuration data 90 can be downloaded from host system 30 to FPGA device 10 via interface circuit 20 after power-up, reconfiguration and/or reset. Configuration data 90 embodies the further logic functions desired to be implemented by FPGA device 10 after the first predefined logic function is established. That is, the downloaded configuration data 90 can then allow FPGA device 10 to migrate to a second state or other logic functions.

Figure 9:
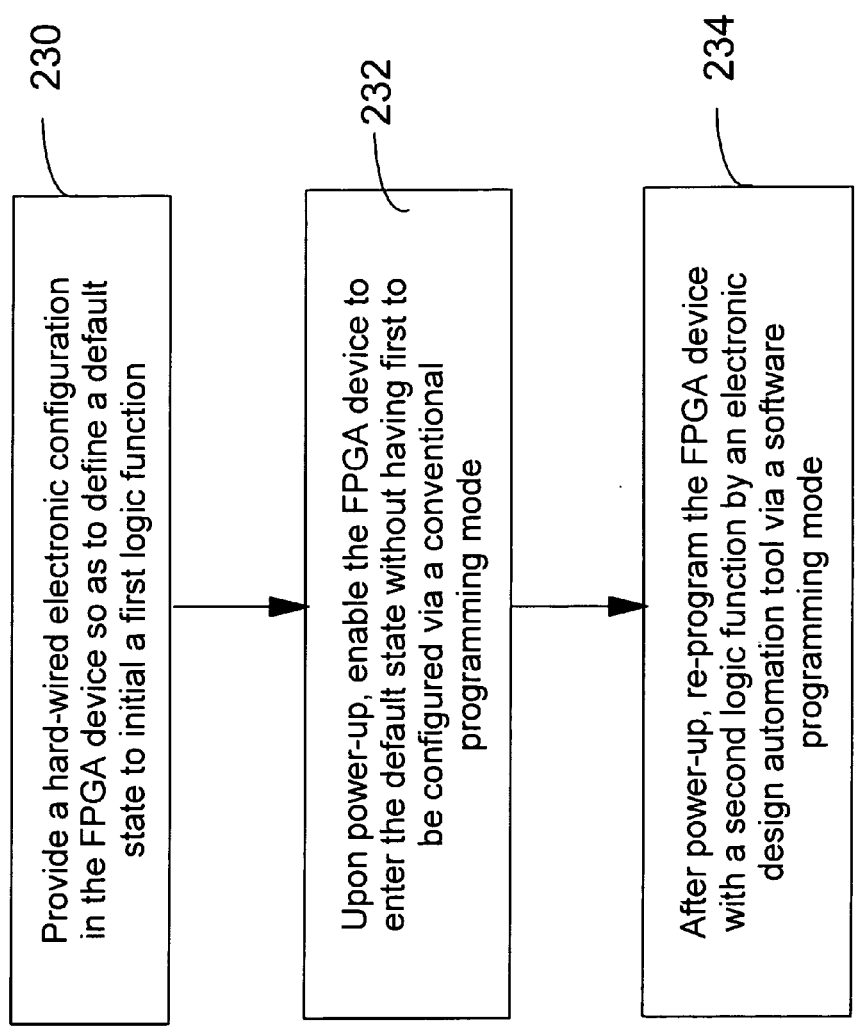
FIG. 9 is a flow diagram illustrating an FPGA configuration method in accordance with the present invention.

FIG. 9 is a flow diagram illustrating an FPGA configuration method in accordance with the present invention. In sum, one preferred embodiment of the FPGA configuration method in accordance with the invention generally comprises the following steps.

Step 230: Provide a non-programming-based default power-on electronic configuration in the FPGA device so as to define a default state to initial a first logic function.

Step 232: Upon power-up, enable the FPGA device to enter the default state without having first to be configured via a conventional programming mode.

Step 234: After power-up, re-program the FPGA device with a second logic function by an electronic design automation tool via a software programming mode. Another FPGA configuration method in accordance with the present invention is also provided. The configuration method is to provide an FPGA device 10 having a first logic function and at least another second logic function. FPGA device 10 has an on-chip non-volatile memory and an on-chip volatile memory, which both comprise a configuration memory/memory cells capable of being partially and/or fully configured, programmed and/or re-programmed to achieve their intended logic functions and purposes. The on-chip non-volatile memory can be, for example, a programmable read only memory (PROM), a mask-PROM, an erasable PROM (EPROM), a UV-erase EPROM, a one-time PROM, an electrically erasable PROM (EEPROM), or a flash memory. The on-chip volatile memory can be, for example, SRAM or dynamic random access memory (DRAM) though SRAM is preferred in accordance with the present invention.

The first logic function has an initialized logic state by a non-programming-based default power-on state so that FPGA device 10 is enabled to enter the default initialized logic state without having first to be configured via a conventional programming mode. A second logic function may replace the default logic function, using conventional configuration means. Due to the limited total memory capacity/space in FPGA device 10, a simpler default initialized logic state and function is preferred because it may take fewer memory cells for non-programming-based default power-on, saving configuration memory for further reconfiguration. In order to establish the first logic function to initiate FPGA device 10 upon power-up, a non-programming-based default power-on configuration is built into FPGA device 10 by dedicating a predefined portion of a programmable resource associated with the non-volatile memory to the first logic function. Moreover, due to the limited total memory capacity/space in FPGA device 10, it is preferred to reduce the size of the non-volatile memory in correspondence with the portion of the programmable resource dedicated to the first logic function. That is, the size of the non-volatile memory dedicated to the first logic function is reduced to the extent that enough configuration memory space is left for programming the second logic function after the FPGA is powered up. Then a fixed interconnect structure including IOBs 110, CLBs 120, programmable interconnect structure 130 and PSMs 140 can be properly provided just to realize the corresponding first (default) logic function.

Figure 10:
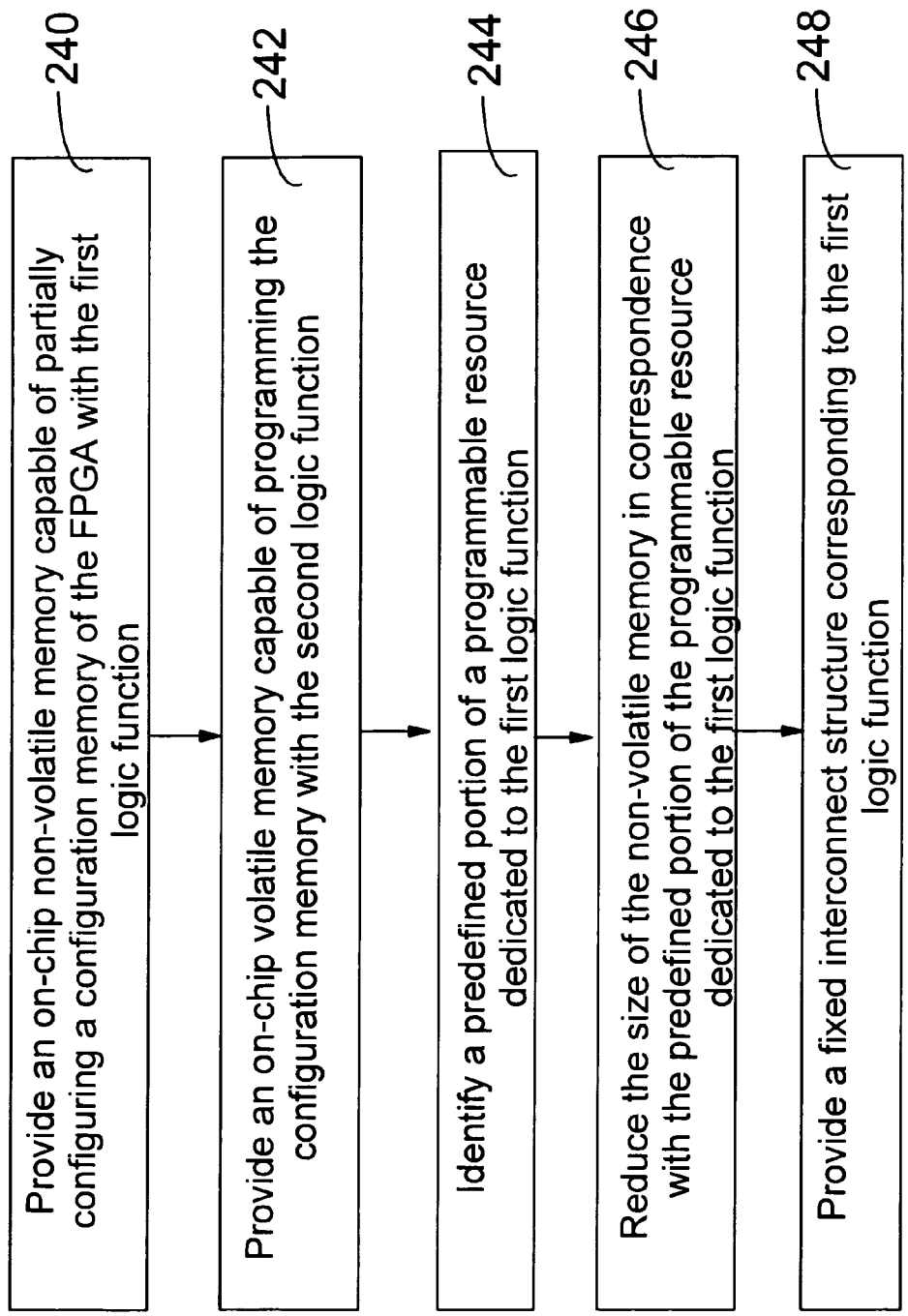
FIG. 10 is a flow diagram illustrating another FPGA configuration method in accordance with the present invention.

FIG. 10 is a flow diagram illustrating another FPGA configuration method in accordance with the present invention. In sum, another preferred embodiment of the FPGA configuration method in accordance with the invention generally comprises the following steps.

Step 240: Provide an on-chip non-volatile memory capable of configuring a configuration memory of the FPGA with the (first) power-on logic function.

Step 242: Provide an on-chip volatile memory capable of programming the configuration memory with the second logic function.

Step 244: Identify a predefined portion of a programmable resource dedicated to the first logic function.

Step 246: Reduce the size of the non-volatile memory in correspondence with the predefined portion of the programmable resource dedicated to the first logic function because it is no longer necessary.

Step 248: Provide a fixed interconnect structure corresponding to the first logic function.

The above-described invention, as seen in the previous examples and figures, provides a non-programming-based default power-on electronic configuration in FPGA device 10 to achieve several advantages over the existing art. For example, the non-programming-based default power-on electronic configuration is designed to define a default state to automatically initial and perform a first predefined logic function. Upon power-up, FPGA device 10 neither goes into a "disabled" mode nor loads the externally-stored configuration data in the first instance. In this setting, it would save processing time during power-up and improve the overall performance of FPGA device 10. Moreover, after a fast power-up, the present invention still allows FPGA device 10 to perform further functional programming in a standard FPGA programming manner. This can allow the incremental programming of FPGA device 10 based on the existing non-programming-based default power-on configured logic function by either replacing existing function or adding new functions to previously unused portions of FPGA device 10. That is, the first predefined logic function can be designed to match either the customer functions or the standard part number default functions (for example, GDSII Vias). Furthermore, for memory preservation concern, the default logic function can be made simpler to reduce the used memory cells in non-programming-based default power-on configuration and save the rest for further programming usage.

Figure 11:
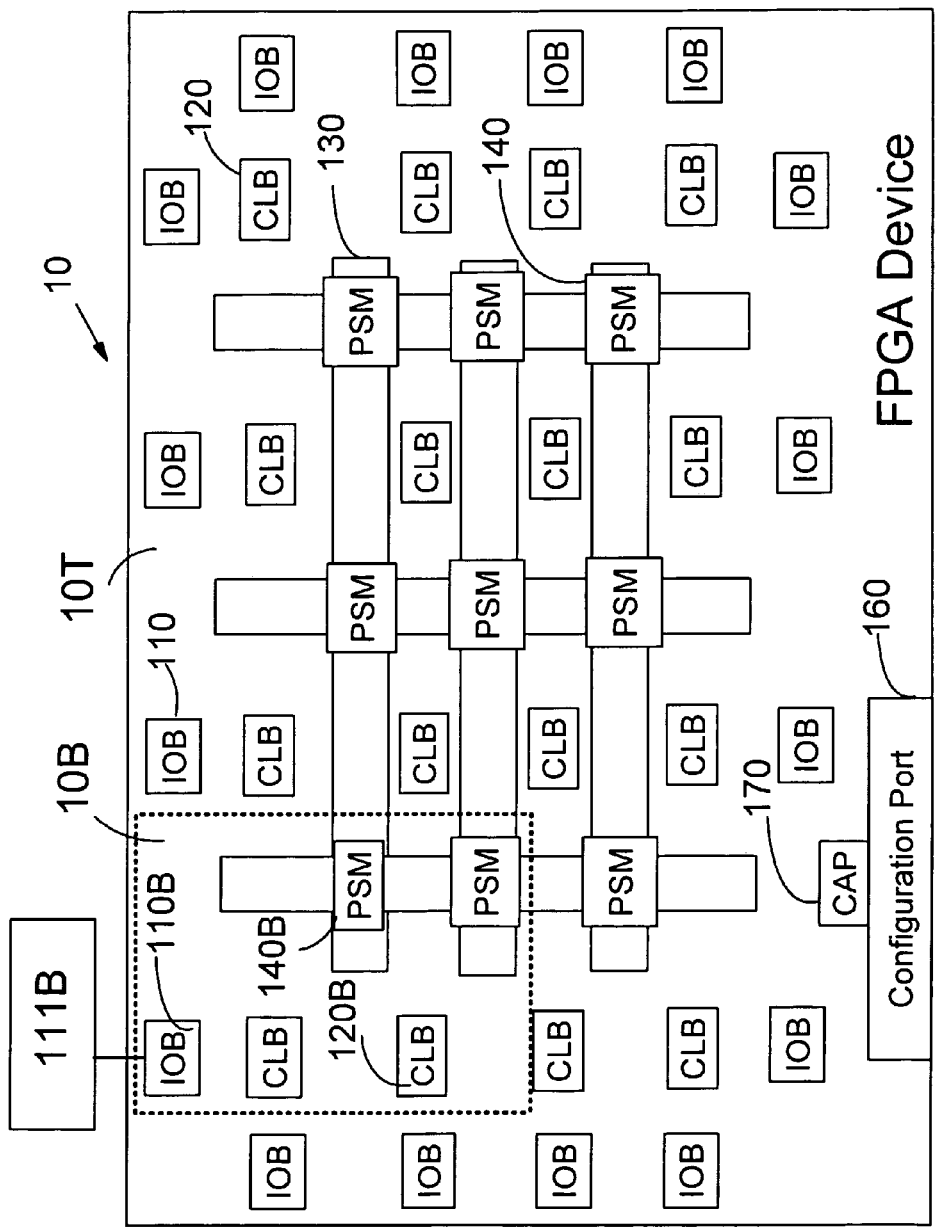
FIG. 11 shows an illustrative embodiment of the architecture of the FPGA device of FIG. 2 including a BIST engine.

According to one embodiment, this invention may be applied to implement a built-in power-up self-test engine. For example, at power-up/reset, a portion of FPGA device 10 may be automatically configured to its default power-on state to function as a Built-In Self-Test (BIST) engine. The BIST engine is designed and implemented to use a portion of FPGA device 10, including CLBs 120 and PSMs 140, to test the rest or portions of the rest of FPGA device 10. FIG. 11 shows an illustrative embodiment of the architecture of FPGA device 10 including a BIST engine 10B. Referring now to FIG. 11, a portion of FPGA device 10, shown in a dotted block, is used to implement a BIST engine 10B, while the rest of the FPGA is to be tested and is marked as 10T. The CLBs and PSMs of BIST engine 10B are marked as 120B and 140B, respectively. A state machine 111B is coupled to BIST engine 10B via, for example, IOB 110B, to generate signals and patterns to test the CLBs 120 and PSMs 140 of device 10T. For example, state machine 111B may generate signals to set CLBs 120B of BIST engine 10B to their default power-on states. The default power-on states of CLBs 120B of BIST engine 10B may be routed to CLBs 120 of device 10T through, for example, programmable interconnect structure 130 including PSMs 140 and PSMs 140B. The responsive states of CLBs 120 of device 10T may be output by IOBs 110, which may be evaluated to determine whether device 10T, including CLBs 120, is in a satisfactory status to be programmed. After the test is completed, state machine 111B may disengage BIST 10B, which may be configured back to be a portion of FPGA device 10 to be programmed.

It is understood that multiple BIST engines may be implemented to test the entire FPGA device 10. For example, an initial BIST engine may be implemented in one portion of FPGA device 10 to test another portion (test portion) of device 10. If the test portion passes the test, a reset is generated, e.g., through state machine 111B, which may configure this test portion to be a new BIST engine designed to test other portions of device 10 including the portion of the initial BIST engine. When the entire region of FPGA device 10 has been successfully tested and determined as satisfactory, FPGA device 10 may be programmed. As such, the reliability of FPGA device 10 may be improved since this self test may be run at every power-up (or even every reset/reconfiguration). If the test is not successful, the power-up of FPGA device 10 may be suspended with a failure notification communicated to a user.

While this invention has been described in conjunction with the specific embodiment outlined above, it is evident that many alternatives, modifications and variations will be apparent to those skilled in the art. Accordingly, the embodiment of the invention as set forth above is intended to be illustrative, not limiting. Various changes may be made without departing from the spirit and scope of the invention as defined in the following claims.

What is claimed is:

1. A field programmable gate array (FPGA) device comprising:

a non-programming-based default power-on electronic configuration defining a default state to initial a first logic function so that, upon power-up, the FPGA device is enabled to enter the default state without being configured via a programming mode; and a built-in self test (BIST) element configured to perform a power-up self test of the FPGA.

2. The FPGA device of claim 1, further comprising a first state machine coupled to the BIST element, the first state machine being configured to generate signals and patterns to test the FPGA device and disengage the BIST element.

3. The FPGA device of claim 1, wherein the non-programming-based default power-on electronic configuration is a mask via circuit including a plurality of configuration memory cells having a plurality of wire straps, a plurality of mask vias or a plurality of resistor loads, and wherein each of the configuration memory cells is capable of being configured to either a voltage source or a ground line by position of the mask via so that the configuration memory cells in the mask via circuit are configured to automatically perform the first logic function upon power-up.

4. The FPGA device of claim 3, wherein the configuration memory cell is a static random access memory (SRAM) cell.

5. The FPGA device of claim 1, wherein the non-programming-based default power-on electronic configuration is an asynchronous set/reset circuit including a plurality of configuration memory cells, a plurality of switches, a voltage source and a ground line, and wherein the plurality of configuration memory cells are configured to either the voltage source or the ground line by control of the corresponding switches to automatically perform the first logic function upon power-up.

6. The FPGA device of claim 1, wherein the non-programming-based default power-on electronic configuration is an unbalanced latch circuit including a plurality of memory cells, each memory cell having a first side circuit and a second side circuit, and wherein each of the side circuits has two transistors of different loads to render different binary states so that the memory cells in the unbalanced latch circuit are configured to automatically perform the first logic function upon power-up.

7. The FPGA device of claim 1, wherein the non-programming-based default power-on electronic configuration is a flush and scan circuit including a plurality of latch elements in a series for rendering corresponding binary states, and wherein each of the latch elements has a positive leg and a negative leg for outputting signals to a next latch element.

8. The FPGA device of claim 7, wherein in the case that the positive leg is connected to the next latch element, the binary state of the next latch element is maintained at the same binary state as the binary state of the previous latch element, and in the case that the negative leg is connected to the next latch element, the binary state of the next latch element is changed to be different from the binary state of the previous latch element.

9. The FPGA device of claim 1, wherein, after power-up, the FPGA device is capable of being re-programmed by an electronic design automation tool via a firmware/software programming mode.

10. The FPGA device of claim 1, wherein the BIST element includes a portion of the FPGA device.

11. A method of configuring a field programmable gate array (FPGA) device, the method comprising:
providing a non-programming-based default power-on electronic configuration defining a default state to initial a first logic function;
upon power-up, enabling the FPGA device to enter the default state without being configured via a programming mode; and
performing a power-up self test of the FPGA device using a built-in self test (BIST) element.

12. The method of claim 11, further comprising:
after power-up, re-programming the FPGA device with a second logic function by an electronic design automation tool via a software/firmware programming mode.

13. The method of claim 11, further comprising:
implementing the non-programming-based default power-on electronic configuration by a mask via circuit comprising a plurality of configuration memory cells having a plurality of wire straps, a plurality of mask vias and a plurality of resistor loads; and
configuring the configuration memory cells to one of a voltage source and a ground line by positions of the mask vias.

14. The method of claim 11, further comprising:
implementing the non-programming-based default power-on electronic configuration by an asynchronous set/reset circuit comprising a plurality of configuration memory cells, a plurality of switches, a voltage source and a ground line; and
configuring the configuration memory cells to either the voltage source or the ground line by control of the corresponding switches.

15. The method of claim 11, further comprising:
implementing the non-programming-based default power-on electronic configuration by an unbalanced latch circuit comprising a plurality of memory cells, wherein each memory cell has a first side circuit and a second side circuit and each of the side circuits has two transistors of different loads to render different binary states.

16. The method of claim 11, further comprising:
implementing the non-programming-based default power-on electronic configuration by a flush and scan circuit comprising a plurality of latch elements in a series for rendering corresponding binary states; and
outputting signals to a next latch element by either a positive leg or a negative leg of the latch element;
wherein in the case that the positive leg is connected to the next latch element, the binary state of the next latch element is maintained at the same binary state as the binary state of the previous latch element, and in the case that the negative leg is connected to the next latch element, the binary state of the next latch element is changed to be different from the binary state of the previous latch element.

17. The method of claim 11, further comprising generating signals and patterns to enable the BIST element to test the FPGA device and to disengage the BIST element.

18. A method of configuring a field programmable gate array (FPGA) with a first logic function having an initialized logic state and a second logic function having an un-initialized logic state, the method comprising:
(a) providing an on-chip non-volatile memory capable of partially configuring a configuration memory of the FPGA with the first logic function;
(b) providing an on-chip volatile memory capable of programming the configuration memory with the second logic function;
(c) identifying a predefined portion of a programmable resource dedicated to the first logic function;
(d) reducing a size of the non-volatile memory in correspondence with the predefined portion of the programmable resource dedicated to the first logic function;
(e) providing a fixed interconnect structure corresponding to the first logic function; and
(f) performing a power-up self test of the FPGA device using a built-in self test (BIST) element.

19. The method of claim 18, wherein the on-chip non-volatile memory is selected from the group consisting of a programmable read only memory (PROM), a mask-PROM, an erasable PROM (EPROM), a UV-erase EPROM, a one-time PROM, an electrically erasable PROM (EEPROM), and a flash memory.

20. The method of claim 18, wherein the fixed interconnect structure includes a ring of input/output blocks (IOBs), an inner two-dimensional array of configurable logic blocks (CLBS), and a programmable interconnect structure having a matrix of programmable switches (PSMs).

* * * * *